(12) United States Patent
Nakamura et al.

(10) Patent No.: US 6,781,832 B2
(45) Date of Patent: Aug. 24, 2004

(54) COOLING UNIT FOR COOLING HEAT GENERATING COMPONENT AND ELECTRONIC APPARATUS CONTAINING COOLING UNIT

(75) Inventors: Hiroshi Nakamura, Ome (JP); Nobuto Fujiwara, Ome (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/085,429

(22) Filed: Feb. 28, 2002

(65) Prior Publication Data

US 2002/0149913 A1 Oct. 17, 2002

(30) Foreign Application Priority Data

Feb. 28, 2001 (JP) ........................................ 2001-055207

(51) Int. Cl.[7] .............................................. H05H 7/20
(52) U.S. Cl. ...................... 361/695; 165/80.3; 165/121; 165/185; 257/719; 257/729; 361/704; 361/707; 361/715; 361/710
(58) Field of Search ................................ 165/80.2, 80.3, 165/121, 126, 185; 257/706–707, 712–713, 718–719, 726–727; 361/687, 694–695, 697, 704–710, 715, 719–721; 454/184

(56) References Cited

U.S. PATENT DOCUMENTS 4,639,829 A * 1/1987 Ostergren et al. ............ 361/707
5,640,302 A 6/1997 Kikinis
6,223,815 B1 * 5/2001 Shibasaki ..................... 361/708

FOREIGN PATENT DOCUMENTS

| JP | 61-15353 | 1/1986 |
| JP | 9-213847 | 8/1997 |
| JP | 11-121662 | 4/1999 |
| TW | 355913 | 4/1999 |
| TW | 413352 | 11/2000 |
| TW | 2001-055207 | 2/2001 |

* cited by examiner

Primary Examiner—Gregory D. Thompson
(74) Attorney, Agent, or Firm—Pillsbury Winthrop LLP

(57) ABSTRACT

A cooling unit comprises a heat sink arranged adjacent to a heat generating component, the heat sink having area dimensions greater than the heat generating component. A heat diffusing member is arranged between the heat generating component and the heat sink. A first heat conducting member is interposed between the heat generating component and the heat diffusing member, and a second heat conducting member is interposed between the heat diffusing member and the heat sink. The heat diffusing member has a thermal conductivity higher than the second heat conducting member and area dimensions greater than the heat generating component.

31 Claims, 11 Drawing Sheets

COOLING UNIT FOR COOLING HEAT GENERATING COMPONENT AND ELECTRONIC APPARATUS CONTAINING COOLING UNIT

CROSS-REFERENCE TO RELATED APPLICATIONS

This application is based upon and claims the benefit of priority from Japanese Patent Application No. 2001-055207, filed Feb. 28, 2001.

BACKGROUND OF THE INVENTION

1. Field of the Invention

This invention relates to a cooling unit for improving the radiation efficiency of a heat generating component, such as a semiconductor package and an electric apparatus, such as a portable computer provided with such a cooling unit.

2. Description of the Related Art

Notebook-type portable computers, PDAs (personal digital assistants) and other portable electronic apparatuses typically comprise a semiconductor package for processing multimedia information in the form of characters, sounds, and images. These days, such semiconductor packages consume more and more energy as their information processing rates are increased, and as they are made to provide more multi-functionally. As a result, they generate proportionally more heat than ever.

Under these circumstances, it is necessary to improve the radiation efficiency of the semiconductor package in order to ensure the stability of operation of the electric apparatus. In other words, it is indispensable that the semiconductor package be provided with any of a variety of available radiation/cooling means, such as a heat sink.

Conventional heat sinks have a heat receiving portion, which is thermally connected to the IC chip of the semiconductor package. If the IC chip and the heat receiving portion are separated from each other by a gap, the gap operates as a thermal insulation layer. Then, the transmission of heat from the IC chip to the heat receiving portion is blocked by the gap. Therefore, conventionally, the gap, if any, between the IC chip and the heat receiving portion is filled with thermally conductive grease, or a thermally conductive sheet is arranged in the gap. With such an arrangement, heat can be reliably transmitted from the IC chip to the heat receiving portion to improve the radiation efficiency of the IC chip.

In recent years, BGA (ball grid array) packages have constituted the mainstream of semiconductor packages of electronic apparatuses. A BGA package is provided on the surface mount device (SMD) located opposite to the IC chip with a number of solder balls arranged in the form of a grid. When BGA packages are mounted on respective circuit substrates, their heights can be dispersed within a range of ±0.25 mm.

On the other hand, a heat sink is fitted to the circuit substrate so as to cover the BGA package. Heat sinks are typically formed by way of injection molding of an aluminum alloy that is highly thermally conductive. However, the various parts including the heat receiving portion of a heat sink produced by injection molding can inevitably show dimensional variances due to solidification and contraction. Therefore, the distance from the heat receiving portion to the circuit substrate can vary considerably when the heat sink is fitted to the latter.

Thus, the gap between the heat receiving portion of the heat sink and the IC chip can become significantly large due to the dispersion of height of the BGA package and the dimensional inaccuracy of the heat sink. When the gap separating the IC chip and the heat sink becomes large, the thickness of the grease or the thermally conductive sheet interposed between them has to be raised correspondingly. Then, the zone thermally connecting the IC chip and the heat receiving portion shows a large thermal resistance.

Additionally, the contact area of the zone thermally connecting the IC chip and the heat receiving portion is substantially as large as the flat surface area of the IC chip. In other words, it is by far smaller than the surface area of the heat receiving portion. Thus, the heat transmission path connecting the IC chip and the heat receiving portion shows a small cross section, and hence heat has to be moved at a very high rate per unit area of the thermally connecting zone. Then, the IC chip and the heat receiving portion show a large temperature difference, and heat cannot be transmitted efficiently from the IC chip to the heat sink.

BRIEF SUMMARY OF THE INVENTION

Therefore, it is an object of the present invention to provide a cooling unit that can effectively absorb the dimensional variances of the zone thermally connecting the heat generating component that may typically be an IC chip and the heat sink, and efficiently transmit heat from the heat generating component to the heat sink to improve the radiation efficiency of the heat generating component.

Another object of the present invention is to provide an electronic apparatus containing such a cooling unit.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out herein after.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION

The present invention will now be described by referring firstly to FIGS. 1 through 13, illustrating a first embodiment of the invention as applied to a portable computer.

Figure 1:
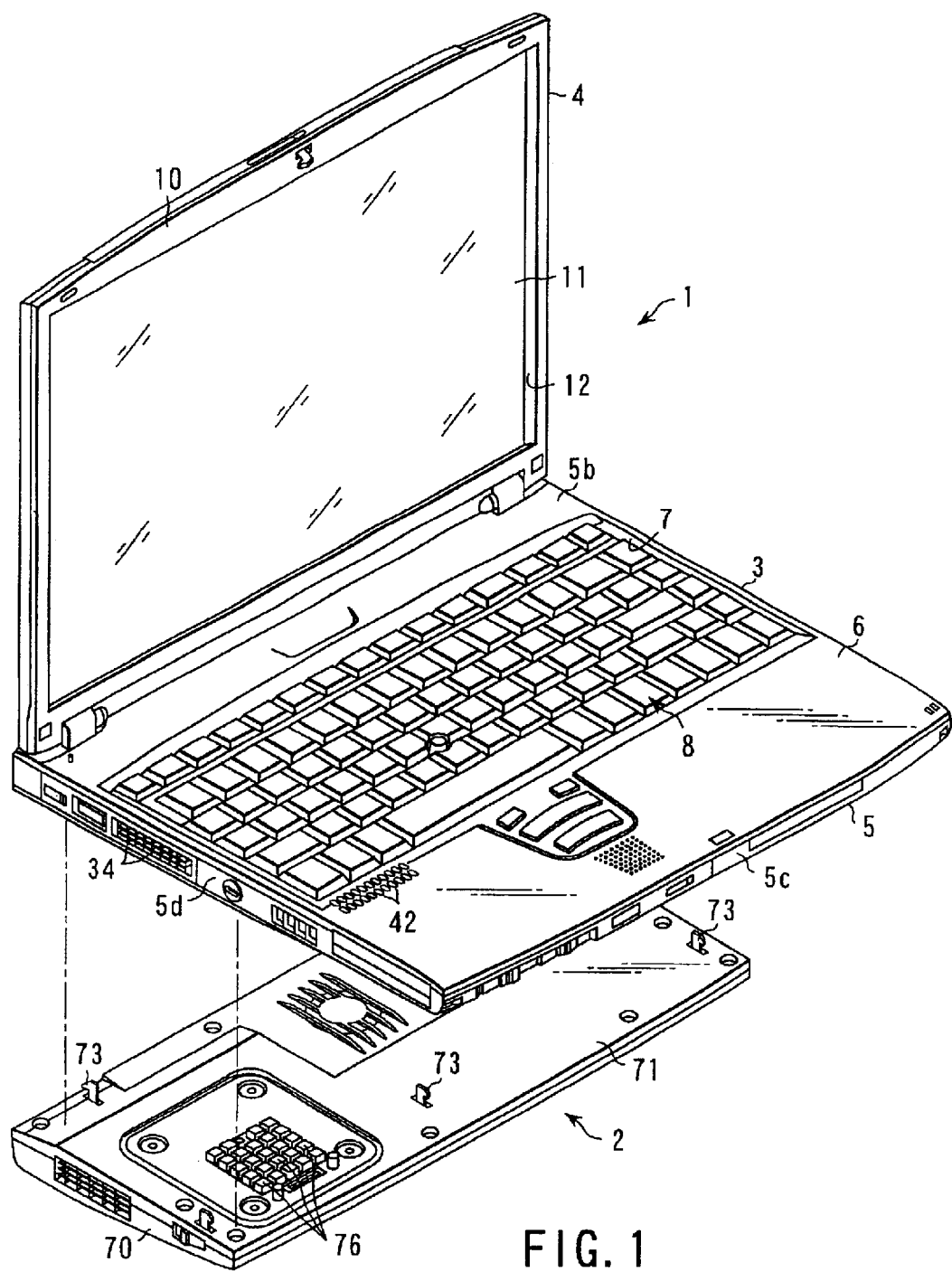
FIG. 1 is an exploded schematic perspective view of a first embodiment of the invention, illustrating a positional relationship of a portable computer and a cooling unit thereof.
Figure 2:
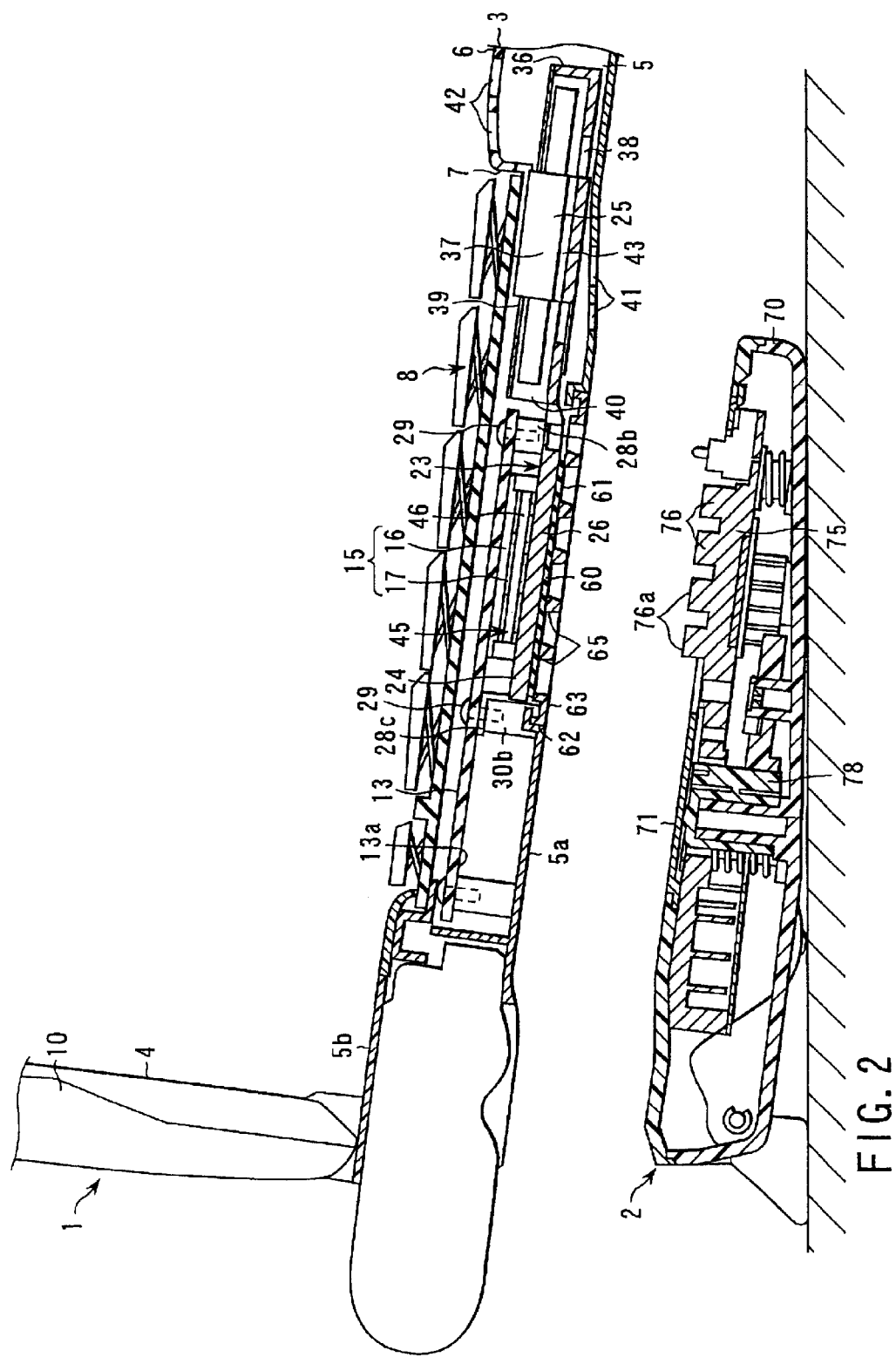
FIG. 2 is a schematic cross-sectional view of a portable computer, illustrating a positional relationship of a portable computer and a cooling unit of the embodiment.

FIGS. 1 and 2 show a portable computer 1 as an electronic apparatus and a cooling apparatus 2 adapted to cool the portable computer 1.

The portable computer 1 comprises a computer main body 3 and a display unit 4 held by the computer main body 3. The computer main body 3 has a flat housing 5. The housing 5 comprises a bottom wall 5a, a top wall 5b, a front wall 5c, a pair of side walls 5d, and a rear wall 5e. A palm rest 6 and a keyboard fitting section 7 are arranged on the top wall 5b of the housing 5. The palm rest 6 is located on the front half of the top wall 5b of the housing 5, whereas the keyboard fitting section 7 is found behind the palm rest 6 and a keyboard 8 is arranged in the keyboard fitting section 7.

The display unit 4 has a display housing 10 and a liquid crystal display panel 11. The liquid crystal display panel 11 is housed in the display housing 10 and exposed to the outside through the front opening 12 of the display housing 10.

The display housing 10 is linked at an end thereof to the rear end of the housing 5 by way of a hinge device (not shown). Thus, the display unit 4 can rotate between a closed position where it completely covers the palm rest 6 and the keyboard 8 and an open position where it stands upright to expose the palm rest 6, the keyboard 8, and the liquid crystal display panel 11.

Figure 3:
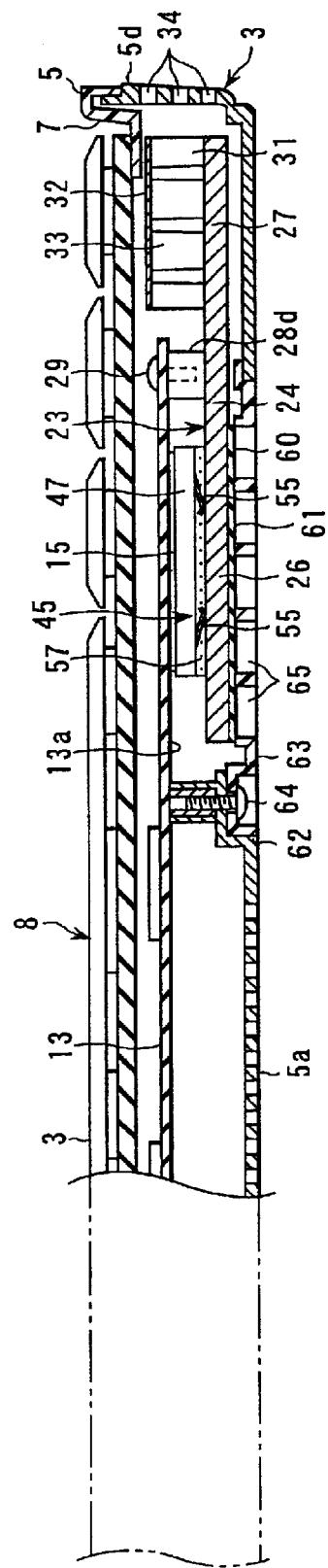
FIG. 3 is a schematic cross-sectional view of a portable computer, illustrating a positional relationship of a semiconductor package and a cooling unit of the embodiment.

As shown in FIGS. 2 and 3, the housing 5 contains therein a circuit substrate 13. The circuit substrate 13 has a mount surface 13a that faces the bottom wall 5a of the housing 5. A BGA-type semiconductor package 15 is mounted on the mount surface 13a as an electronic component. The semiconductor package 15 contains a microprocessor that is the core of the portable computer 1.

Figure 6:
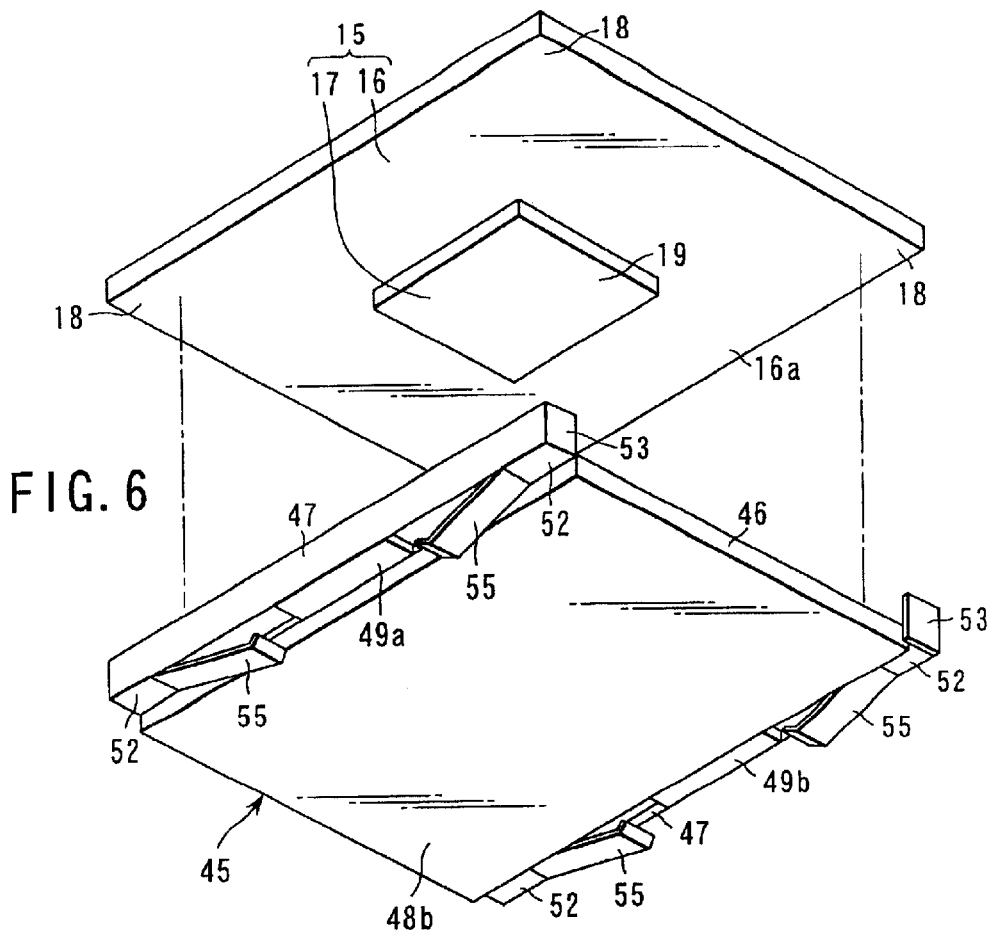
FIG. 6 is a schematic perspective view of the embodiment, illustrating a positional relationship of a semiconductor package and a heat diffusing member thereof.
Figure 8:
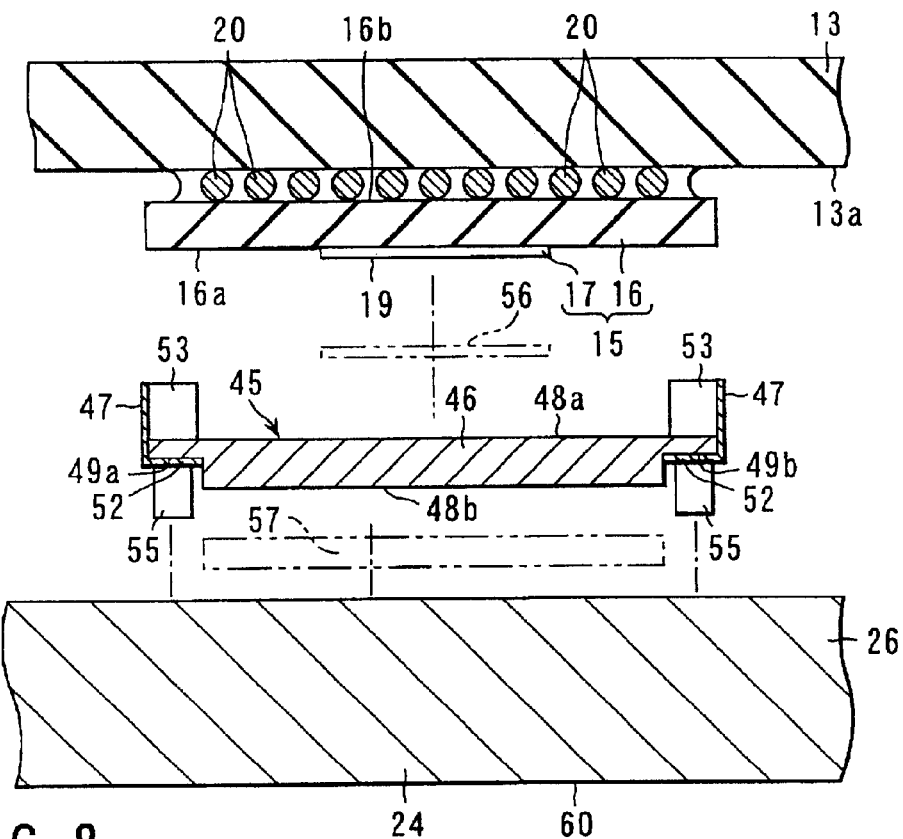
FIG. 8 is a schematic cross-sectional view of the embodiment, illustrating a positional relationship of a BGA-type semiconductor package, a heat diffusing member and a heat sink thereof.

As shown in FIGS. 6 and 8, the semiconductor package 15 comprises a base substrate 16 and an IC chip 17 that is a heat generating component. The base substrate 16 has a rectangular profile having four corners 18 at the outer periphery thereof. The length of each side of the base substrate 16 is about 30 mm. The IC chip 17 processes multimedia information including characters, sounds, and images at high speeds so that it generates heat at an enhanced rate during its operation, and hence needs to be cooled in order to operate stably.

The IC chip 17 has a rectangular profile and is smaller than the base substrate 16. Each side of the IC chip 17 is about 10 mm. The IC chip 17 is soldered to the center of one of the opposite surfaces, or surface 16a, of the base substrate 16. The IC chip 17 has a flat radiation surface 19 located remotely from the base substrate 16. The radiation surface 19 is slightly projected from the surface 16a of the base substrate 16.

A number of solder balls 20 are arranged in the form of a grid on the other surface 16b of the base substrate 16. The solder balls 20 are bonded to the mount surface 13a of the circuit substrate 13. Thus, the semiconductor package 15 is fitted to the circuit substrate 13 with the IC chip 17 facing downward.

Figure 4:
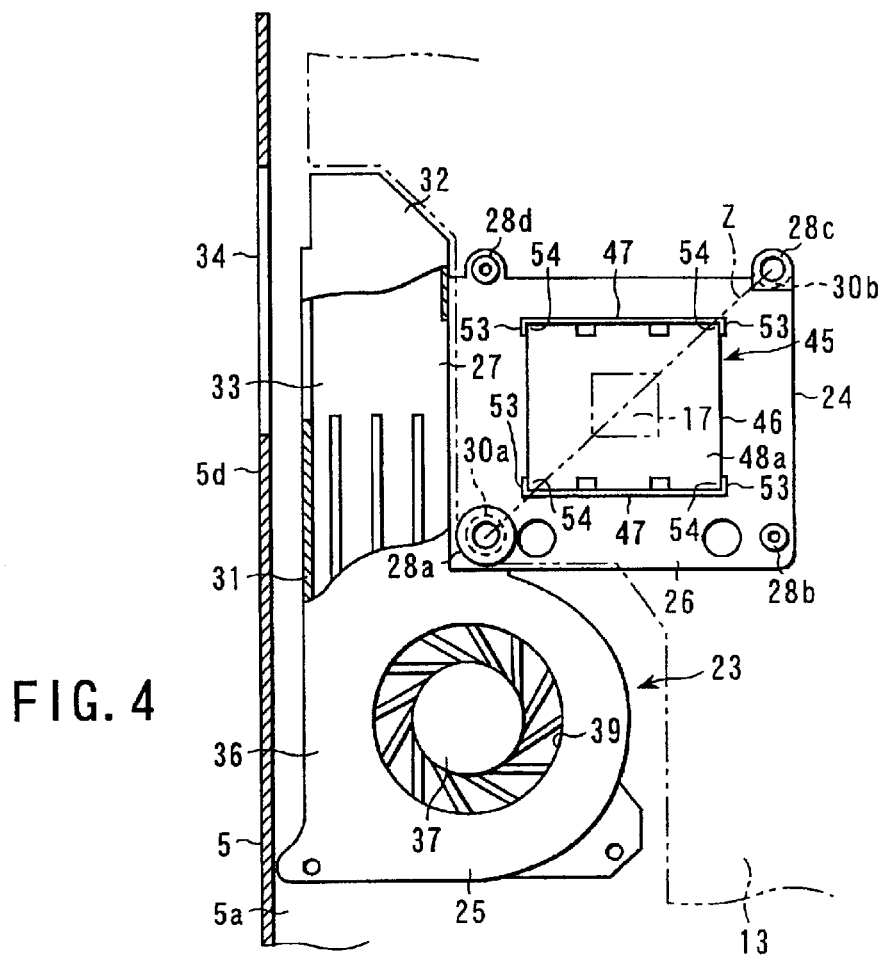
FIG. 4 is a schematic cross-sectional view of a portable computer, illustrating a housing and a cooling unit housed in the housing of the embodiment.

As shown in FIGS. 2 through 4, the housing 5 also contains a cooling unit 23 for cooling the semiconductor package 15. The cooling unit 23 comprises a heat sink 24 and an electrically powered fan unit 25.

The heat sink 24 is made of a metal material such as aluminum alloy that is thermally highly conductive. The heat sink 24 has a heat receiving portion 26 and a heat exchanging portion 27. The heat receiving portion 26 has a flat rectangular profile and its surface area is larger than that of the semiconductor package 15. The heat receiving portion 26 is arranged vis-à-vis the semiconductor package 15 between the bottom wall 5a of the housing 5 and the circuit substrate 13.

Figure 5:
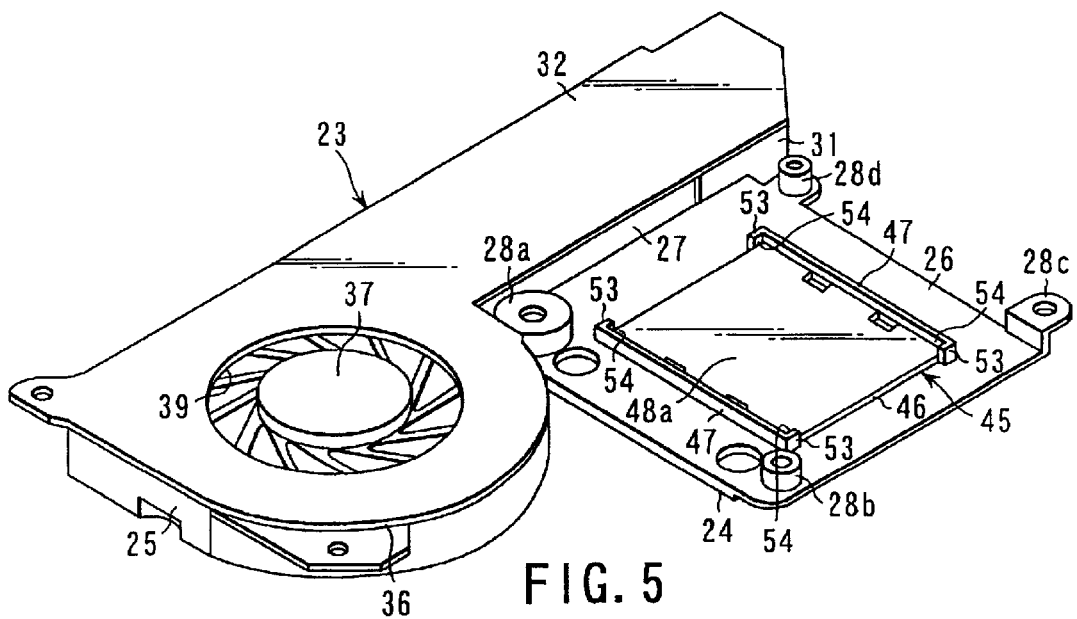
FIG. 5 is a schematic perspective view of a cooling unit of the embodiment.

As shown in FIGS. 4 and 5, the heat receiving portion 26 of the heat sink 24 has four substrate support sections 28a through 28d. The substrate support sections 28a through 28d project respectively from the four corners of the heat receiving portion 26 toward the circuit substrate 13. The circuit substrate 13 is rigidly secured to the free ends of the substrate support sections 28a through 28d by means of respective screws 29. The circuit substrate 13 is provided with grounding pads (not shown) arranged respectively at the positions contacting the substrate support sections 28a through 28d. Thus, the heat sink 24 is grounded by way of the substrate support sections 28a through 28d and the grounding pads located at the respective positions of the circuit substrate 13 contacting them.

Of the four substrate support sections 28a through 28d, the paired sections 28a, 28c that are arranged on diagonal Z of the heat receiving portion 26 are respectively laid on a pair of boss sections 30a, 30b projecting from the bottom wall 5a of the housing 5. Each of the two screws 29 rigidly securing the circuit substrate 13 is driven respectively through the substrate support sections 28a, 28c into the boss sections 30a, 30b. Thus, the heat receiving portion 26 of the heat sink 24 is directly and rigidly secured to the bottom wall 5a of the housing 5 at two positions on the diagonal Z.

As shown in FIGS. 3 through 5, the heat exchanging portion 27 of the heat sink 24 is integral with the heat receiving portion 26 and thermally connected to the latter. The heat exchanging portion 27 is located between the left lateral wall 5d of the housing 5 as viewed from the front side of the housing 5 and the semiconductor package 15. The heat exchanging portion 27 has a support wall 31 extending upward from the outer periphery thereof. A metal ceiling plate 32 is rigidly secured to the upper end of the support wall 31. Thus, the ceiling plate 32 is combined with the heat exchanging portion 27 and the support wall 31 to form a cooling air path 33. The cooling air path 33 communicates at the downstream end thereof with a cooling air outlet port 34 that is open at the left lateral wall 5d of the housing 5.

As shown in FIGS. 2 and 4, the fan unit 25 is arranged immediately in front of the heat sink 24. The fan unit 25 comprises a fan casing 36 and a centrifugal type impeller 37.

The fan casing 36 has a first suction port 38, second suction port 39 and a discharge port 40 and is integral with the heat sink 24. The first suction port 38 is located vis-à-vis a number of first air inlet ports 41 open at the bottom wall 5a of the housing 5. The second suction port 39 is located vis-à-vis a number of second air inlet ports 42 open at the palm rest 6. The discharge port 40 is open toward the heat sink 24 and a part thereof faces the upstream end of the cooling air path 33.

The impeller 37 is supported by the fan casing 36 by way of a flat motor 43. The flat motor 43 is electrically connected to the circuit substrate 13. The flat motor 43 is driven to revolve according to a signal fed from the circuit substrate 13 when the temperature of the semiconductor package 15 reaches a predetermined level.

As the impeller 37 is driven to rotate by the flat motor 43, air is taken in from the inside of the fan casing 36 through the first and second suction ports 38, 39. The air is then discharged from the outer periphery of the impeller 37 as cooling air. Then, the cooling air is sent to the cooling air path 33 and an area surrounding the semiconductor package 15 by way of the discharge port 40.

As shown in FIGS. 8 through 11, the IC chip 17 of the semiconductor package 15 is thermally connected to the heat receiving portion 26 of the heat sink 24 by way of a heat diffusing member 45. The heat diffusing member 45 has a diffusion plate 46 and a pair of lateral plates 47. The diffusion plate 46 and the lateral plates 47 are typically made of a metal material such as aluminum alloy or copper alloy that is highly thermally conductive. They are also electrically conductive.

The diffusion plate 46 has a size substantially equal to the base substrate 16 of the semiconductor package 15 and a thickness of about 2 mm. The diffusion plate 46 has a first thermal contact surface 48a and a second thermal contact surface 48b located opposite to the first thermal contact surface 48a. The first thermal contact surface 48a is located vis-à-vis the semiconductor package 15. The first thermal contact surface 48a has an area far greater than that of the radiation surface 19 of the IC chip 17. The second thermal contact surface 48b is located vis-à-vis the heat receiving portion 26 of the heat sink 24. The second thermal contact surface 48b has an area far greater than that of the radiation surface 19 of the IC chip 17. The first and second thermal contact surfaces 48a, 48b are made very flat and smooth.

The diffusion plate 46 is provided with a pair of recesses 49a, 49b. The recesses 49a, 49b are open to the heat receiving portion 26 and extend respectively along the corresponding opposite edges of the second thermal contact surface 48b.

The lateral plates 47 extend respectively along the corresponding opposite edges of the diffusion plate 46. The lateral plates 47 are provided with respective support parts 52. The support parts 52 are bent perpendicularly so as to be driven into the respective recesses 49a, 49b. The support parts 52 are then rigidly fitted to the respective recesses 49a, 49b by soldering, welding or some other appropriate means.

Figure 7:
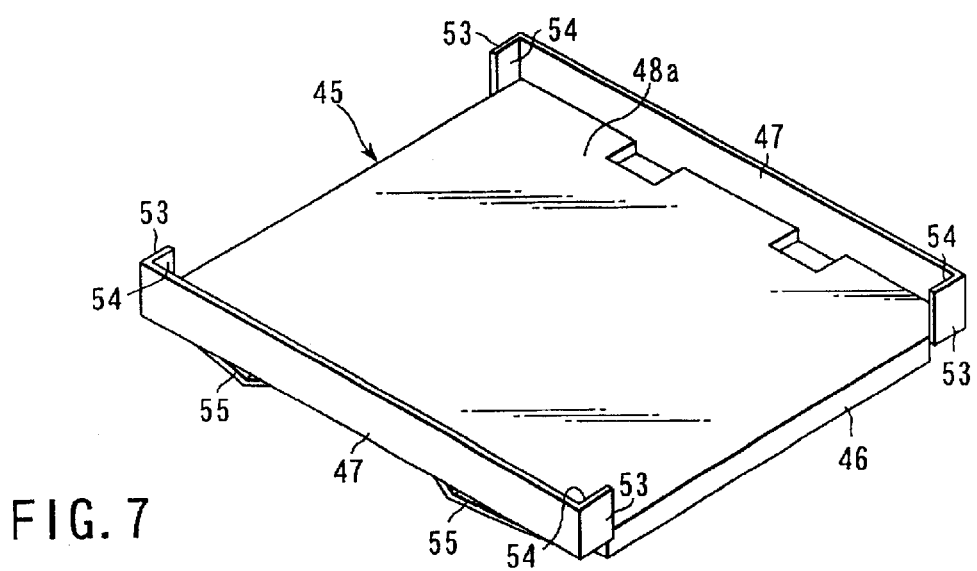
FIG. 7 is a schematic perspective view of a heat diffusing member of the embodiment.

As best shown in FIGS. 7 and 8, the lateral plates 47 are held by the diffusion plate 46 and stand upright perpendicularly relative to the first and second thermal contact surfaces 48a, 48b. The lateral plates 47 project upward from the first thermal contact surface 48a by an amount greater than the projection of the IC chip 17 relative to the base substrate 16. Thus, the projecting sections of the lateral plates 47 are located vis-à-vis relative to each other with the first thermal contact surface 48a interposed between them.

Each of the lateral plates 47 is provided at the longitudinal opposite ends thereof with a pair of tongues 53 that are bent inwardly and perpendicularly. Each of the tongues 53 and the corresponding end of the lateral plate 47 cooperate with each other to form an engaging section 54 that is perpendicularly bent. The engaging sections 54 are arranged at the respective four corners of the first thermal contact surface 48a and correspond to the respective four corners 18 of the base substrate 16 of the semiconductor package 15. The corners 18 of the base substrate 16 are engaged respectively with the corresponding engaging sections 54 to define the relative positional relationship between the semiconductor package 15 and the heat diffusing member 45.

Each of the support parts 52 of the lateral plates 47 has a pair of spring sections 55 formed by bending the lateral plates 47 obliquely downwardly so that they may be resiliently deformed in the direction of the height of the diffusion plate 46. The tip ends of the spring sections 55 extend downward below the second thermal contact surface 48b and contact the heat receiving portion 26 of the heat sink 24.

With the above described arrangement, the heat diffusion member 45 is constantly urged upward by the spring sections 55 between the heat receiving portion 26 and the semiconductor package 15. As a result, the first thermal contact surface 48a of the diffusion plate 46 is pushed upward toward the radiation surface 19 of the IC chip 17.

Additionally, the spring sections 55 are held between the heat diffusing member 45 and the heat receiving portion 26 in a compressed state to electrically connect the heat diffusing member 45 and the heat sink 24. Thus, the heat diffusing member 45 is connected to the grounding pads of the circuit substrate 13 by way of the heat sink 24.

Figure 9:
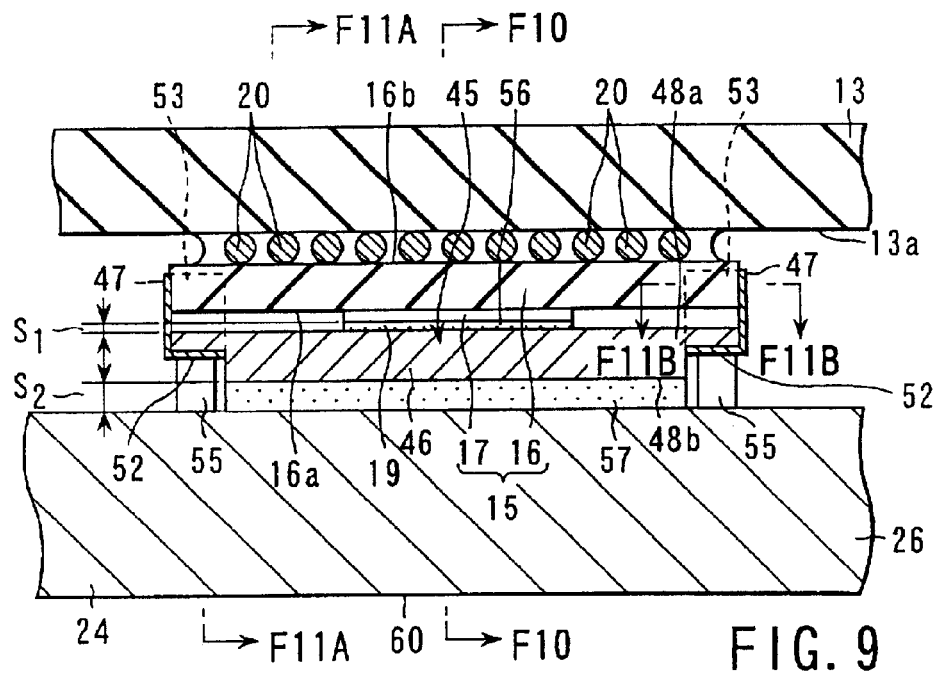
FIG. 9 is a schematic cross-sectional view of the embodiment, illustrating a BGA-type semiconductor package thermally connected to a heat sink by way of a heat diffusing member thereof.
Figure 10:
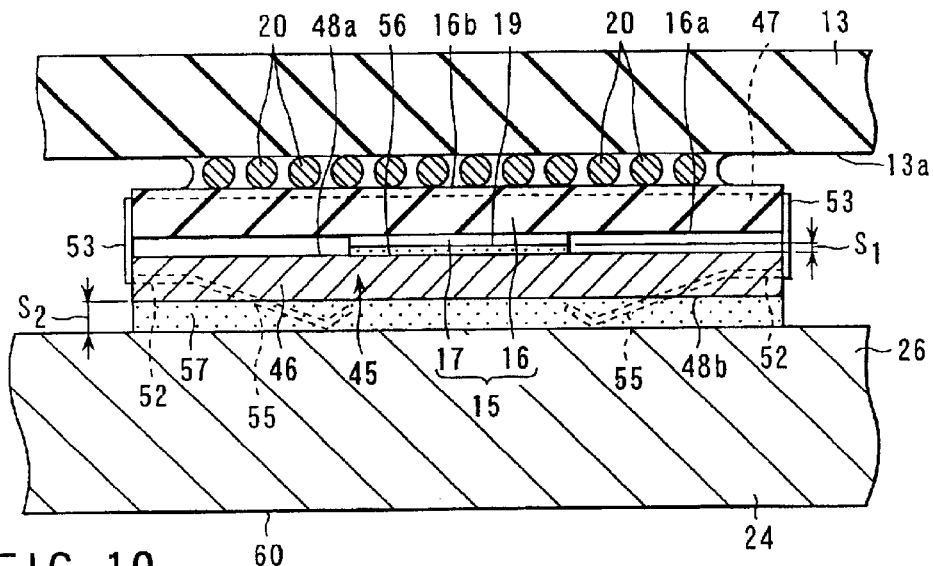
FIG. 10 is a schematic cross-sectional view taken along line F10—F10 in FIG. 9.
Figure 11A:
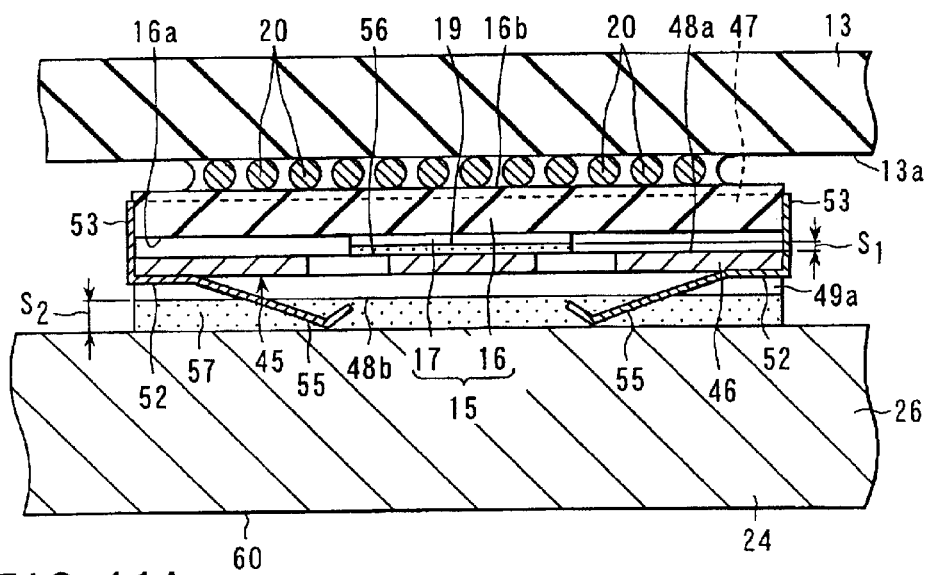
FIG. 11A is a schematic cross-sectional view taken along line F11A—F11A in FIG. 9.
Figure 11B:
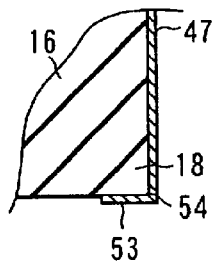
FIG. 11B is a schematic cross-sectional view taken along line F11B—F11B in FIG. 9.

As shown in FIGS. 9 through 11, the heat diffusing member 45 is held in a position biased toward the semiconductor package 15 between the heat receiving portion 26 and the semiconductor package 15. As a result, a gap S1 is produced between the first thermal contact surface 48a of the heat diffusing member 45 and the radiation surface 19 of the IC chip 17, and also another gap S2 is produced between the second thermal contact surface 48b of the heat diffusing member 45 and the heat receiving portion 26. The gap S1 is narrower than the gap S2.

The gap S1 is held to a value infinitesimally close to 0 in order to efficiently conduct heat from the IC chip 17 to the heat diffusing member 45. A first soft heat conducting member 56 typically made of grease is arranged in the gap S1. The first heat conducting member 56 is held in tight contact with the radiation surface 19 of the IC chip 17 and the first thermal contact surface 48a of the heat diffusing member 45 to thermally connect the IC chip 17 and the heat diffusing member 45.

The gap S2 is held to a value that can sufficiently absorb the dimensional variances of the heat sink 24 and the difference between the designed height and the actual height of the semiconductor package 15 relative to the circuit substrate 13. A second soft heat conducting member 57 typically made of grease is arranged in the gap S2. The second heat conducting member 57 is held in tight contact with the second thermal contact surface 48b of the heat diffusing member 45 and the heat receiving portion 26 to thermally connect the heat diffusing member 45 and the heat sink 24. Therefore, the thickness of the first heat conducting member 56 is smaller than that of the second heat conducting member 57.

The heat diffusing member 45 shows a thermal conductivity (W/(m·K)) greater than the first and second heat conducting members 56, 57. In other words, the heat diffusing member 45 conducts heat better than the first and second heat conducting members 56, 57. Thus, the heat transmitted from the IC chip 17 to the diffusion plate 46 of the heat diffusing member 45 by way of the first heat conducting member 56 is dispersed along the first and second thermal contact surfaces 48a, 48b so that heat is transmitted to the second heat conducting member 57 from an area greater than the radiation surface 19 of the IC chip 17.

As shown in FIGS. 2 and 3, the heat receiving portion 26 of the heat sink 24 has a heat emitting surface 60. The heat emitting surface 60 is located remotely from the semiconductor package 15 and directed to the bottom wall 5a of the housing 5. The heat emitting surface 60 has a flat area greater than the semiconductor package 15 and is covered by a soft heat conducting sheet 61.

Figure 12:
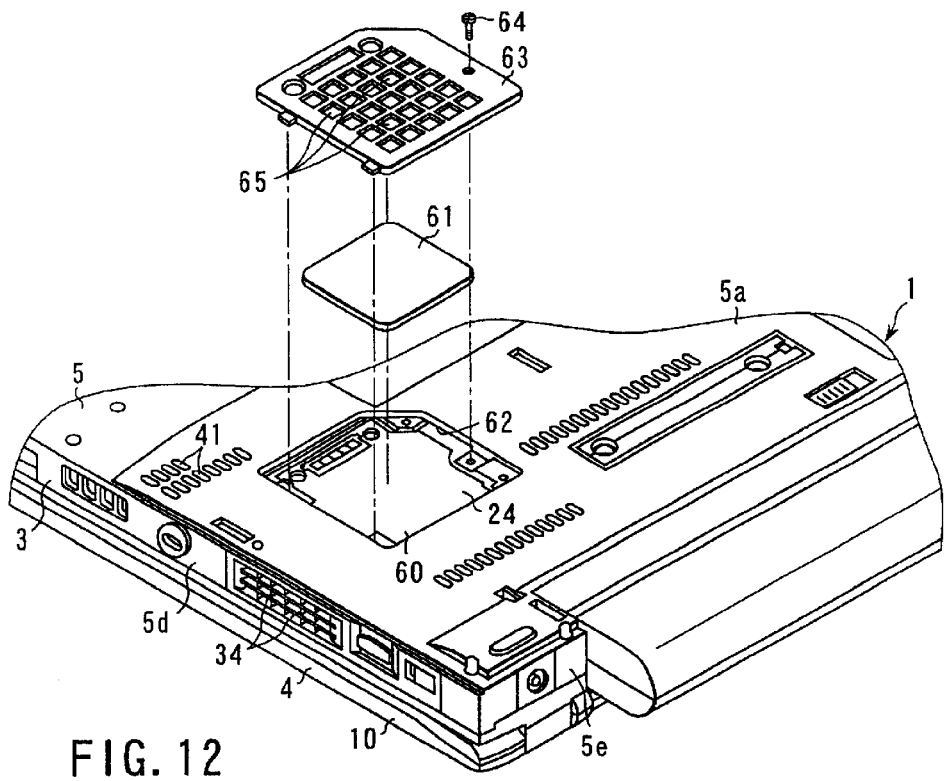
FIG. 12 is an exploded perspective view of a part of a portable computer, illustrating a positional relationship of a bottom wall of a housing, a cover, a thermally conductive sheet and a heat sink of the embodiment.
Figure 13:
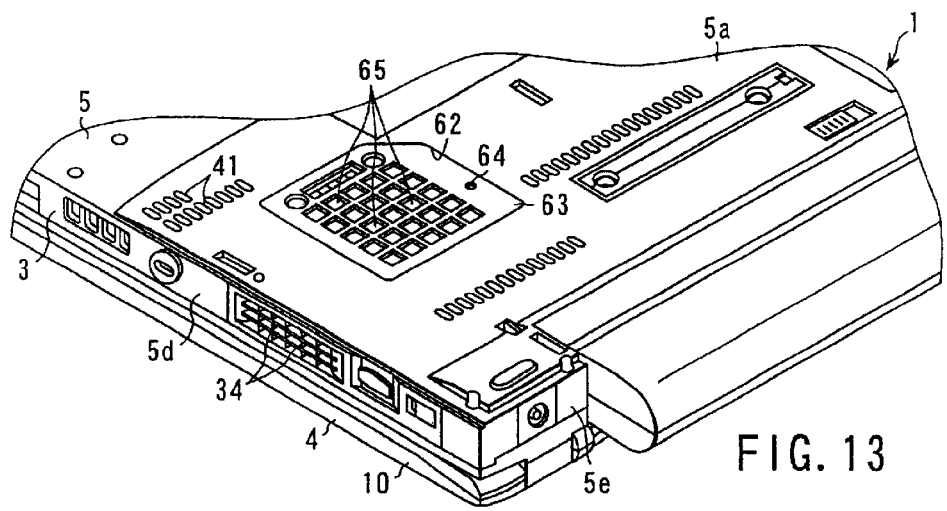
FIG. 13 is a perspective view of a part of a portable computer, illustrating a cover fitted to a bottom wall of a housing of the embodiment.

As shown in FIGS. 12 and 13, the bottom wall 5a of the housing 5 is provided with an opening 62 located vis-à-vis the heat emitting surface 60 of the heat sink 24. The opening 62 is dimensionally larger than the heat emitting surface 60. The opening 62 is covered by a cover 63. The cover 63 is removably supported by the bottom wall 5a by way of a screw 64.

The cover 63 has a plurality of through holes 65, which are arranged to form a checker. Therefore, the heat conducting sheet 61 is exposed to the bottom wall 5a of the housing 5 by way of the through holes 65.

As shown in FIGS. 1 and 2, the cooling apparatus 2 for cooling the portable computer 1 has an apparatus main body 70. The apparatus main body 70 has a flat box-like profile and corresponds dimensionally to the rear half of the housing 5. The upper surface of the apparatus main body 70 serves as receiving surface 71 for receiving the rear half of the housing 5. The receiving surface 71 is provided with a number of lock claws 73. As the housing 5 is placed on the receiving surface 71, the lock claws 73 releasably catch the bottom wall 5a of the housing 5. Then, the housing 5 is locked to the receiving surface 71.

The apparatus main body 70 contains an auxiliary heat sink 75. The auxiliary heat sink 75 is typically made of a metal material such as aluminum alloy that is thermally highly conductive. The heat sink 75 has a number of heat receiving projections 76 projecting upward from the top surface thereof. The heat receiving projections 76 have a prism-like profile so that they can be inserted respectively into the through holes 65 of the cover 63 and are arranged to form a checker. The heat receiving projections 76 are exposed on the receiving surface 71 of the apparatus main body 70. Each of the heat receiving projections 76 has a flat contact surface 76a at the tip end thereof. The contact surfaces 76a of the heat receiving projections 76 are flush with each other.

Thus, as the housing 5 of the portable computer 1 is placed on the receiving surface 71, the heat receiving projections 76 come to be located respectively right under the corresponding through holes 65 of the cover 63 so that the contact surfaces 76a of the heat receiving projections 76 face the heat conducting sheet 61.

The auxiliary heat sink 75 is supported by the apparatus main body 70 in such a way that it is vertically movable between a first position where the contact surfaces 76a of the heat receiving projections 76 project above the receiving surface 71 and a second position where the contact surfaces 76a of the heat receiving projections 76 are substantially flush with the receiving surface 71. The auxiliary heat sink 75 can be moved vertically from the first position to the second position, or vice versa, by means of an operating mechanism 78.

The procedure for connecting the portable computer 1 to the cooling apparatus 2 for use will now be described.

Firstly, the housing 5 is placed on the receiving surface 71 of the apparatus main body 70 and securely held to the receiving surface 71 by means of the lock claws 73. Under this condition, the operating mechanism 78 is operated to push up the auxiliary heat sink 75 from the second position to the first position. As a result, the contact surfaces 76a of the heat receiving projections 76 are driven into the inside of the housing 5 through the respective through holes 65 of the cover 63 and pushed against the heat conducting sheet 61.

Thus, heat conducting sheet 61 is sandwiched by the heat emitting surface 60 of the heat sink 24 and the contact surfaces 76a of the heat receiving projections 76 so that the heat sink 24 is thermally connected to the auxiliary heat sink 75 by way of the heat conducting sheet 61.

At this time, the heat receiving portion 26 having the heat emitting surface 60 is subjected to a force exerted by the heat receiving projections 76 and trying to push it up and move it away from the bottom wall 5a of the housing 5. However, since the heat receiving portion 26 is rigidly secured to the bottom wall 5a of the housing 5 at two positions on the diagonal Z by means of screws 29 and firmly held there, it can reliably resist the force and remain in position. Thus, the heat receiving portion 26 is prevented from becoming rickety and/or being lifted up when the housing 5 is brought into contact with the cooling apparatus 2.

As the portable computer 1 is operated, the IC chip 17 of the semiconductor package 15 generates and emits heat. The heat generated by the IC chip 17 is transmitted to the diffusion plate 46 of the heat diffusing member 45 by way of the first heat conducting member 56 and then to the heat receiving portion 26 of the heat sink 24 by way of the second heat conducting member 57. As a result, the heat emitting surface 60 of the heat receiving portion 26 is heated to a high temperature by the heat transmitted from the IC chip 17. The heat emitting surface 60 is thermally connected to the auxiliary heat sink 75 of the cooling apparatus 2 by way of the heat conducting sheet 61. Thus, the heat transmitted from the IC chip 17 to the heat receiving portion 26 is directly transmitted to the auxiliary heat sink 75.

Consequently, the thermal capacity of the heat transmission path extending from the IC chip 17 to the auxiliary heat sink 75 by way of the heat sink 24 is increased. Therefore, the radiation efficiency of the heat generating IC chip 17 is raised to properly maintain the environmental temperature of the semiconductor package 15 in operation.

If the temperature of the semiconductor package 15 rises above a predetermined level while the portable computer 1 is in operation, the fan unit 25 starts to operate. Then, cooling air is led to the cooling air path 33 of the heat sink 24.

The cooling air from the fan unit 25 forcibly cools the heat exchanging portion 27 of the heat sink 24 as it flows through the cooling air path 33 before it is forced out from the housing 5 through the cooling air outlet port 34. Therefore, the heat transmitted from the heat receiving portion 26 to the heat exchanging portion 27 is partly expelled to the outside of the housing 5 by the flow of cooling air to accelerate the thermal discharge of the semiconductor package 15.

With the above described arrangement, the heat diffusing member 45 is sandwiched between the IC chip 17 and the heat receiving portion 26. The first thermal contact surface 48a of the heat diffusing member 45 is pressed against the radiation surface 19 of the IC chip 17 by the paired spring sections 55. Therefore, the gap S1 between the first thermal contact surface 48a and the radiation surface 19 is held infinitesimally close to 0. In other words, the first heat conducting member 56 arranged in the gap is made very thin. Thus, the thermal resistance of the area thermally connecting the first thermal contact surface 48a and the radiation surface 19 is minimized so that the heat generated by the IC chip 17 can be efficiently transmitted to the diffusion plate 46 of the heat diffusing member 45.

Additionally, the first and second thermal contact surfaces 48a, 48b of the diffusion plate 46 have a surface area far greater than that of the radiation surface 19 of the IC chip 17, and the diffusion plate 46 shows a thermal conductivity far greater than the first and second heat conducting members 56, 57. Thus, the heat transmitted from the IC chip 17 to the diffusion plate 46 is quickly dispersed to every corner of the diffusion plate 46 along the first and second thermal contact surfaces 48a, 48b. As a result, heat is transmitted from the IC chip 17 to the heat receiving portion 26 by way of the expanded area that is by far larger than its radiation surface 19 and the second heat conducting member 57.

Thus, the thermal contact area of the heat diffusing member 45 and the heat receiving portion 26 is dimensioned so as to satisfactorily meet the required rate of thermal transmission. In other words, the flow rate of heat per unit area is minimized. Therefore, the thermal resistance of the thermal contact area of the heat diffusing member 45 and the heat receiving portion 26 can be held to a sufficiently low level if the gap S2 between the heat diffusing plate 46 and the heat receiving portion 26 is greater than the gap S1 and the second heat conducting member 57 has a significant thickness. Consequently, the difference between the temperature of the second thermal contact surface 48b and that of the heat receiving portion 26 is minimized.

As described above, heat can be transmitted efficiently from the IC chip 17 to the heat sink 24 to raise the efficiency of thermal discharge of the IC chip 17 by arranging the heat diffusing member 45 in the heat transmission path from the IC chip 17 to the heat sink 24.

Additionally, with the above described arrangement, if the distance between the heat receiving portion 26 and the IC chip 17 departs from the design value due to, for instance, the dimensional variances of the heat sink 24, the soft second heat conducting member 57 contained in the gap S2 is strained and deformed to absorb the change in distance.

More specifically, as the second heat conducting member 57 is strained and deformed, the diffusion plate 46 of the heat diffusing member 45 is apparently held to a floating state relative to the heat sink 24. This means that the heat receiving portion 26 of the heat sink 24 does not need to be arranged in a floating state from the very beginning and hence any movable part can be eliminated from the heat sink 24 to structurally simplify the design of the heat sink 24 and allow the heat sink 24 to have reduced dimensions and light weight.

At the same time, as the heat sink 24 can avoid any movable part, its mechanical strength is improved to make the heat sink 24 free from becoming rickety during transportation of the portable computer 1.

Furthermore, with the above described arrangement, the heat diffusing member 45 laid on the semiconductor package 15 is electrically connected to the grounding layer of the circuit substrate 13 by way of the heat sink 24. Therefore, the semiconductor package 15 can be electromagnetically shielded by utilizing the heat diffusing member 45. Thus, any electromagnetic noise from the semiconductor package 15 can be prevented from leaking, which is greatly advantageous as an anti-noise measure.

While grease is used for the first heat conducting member 56 in the above described first embodiment, the present invention is by no means limited thereto. For instance, solder may be used in place of grease. Since the thermal conductivity of solder is by far greater than that of grease, the thermal resistance of the area thermally connecting the IC chip 17 and the diffusion plate 46 can be reduced further. Then, heat can be transmitted from the IC chip 17 to the diffusion plate 46 highly efficiently.

Figure 14A:
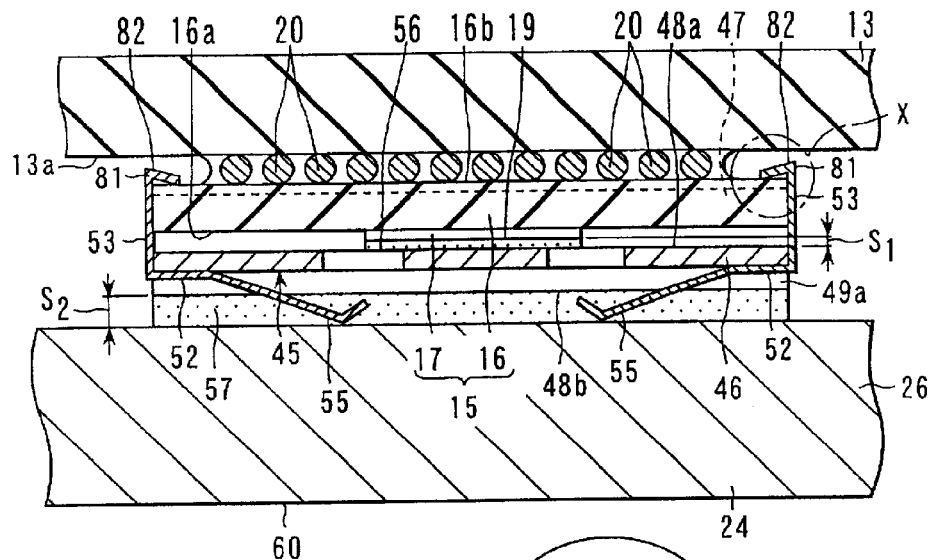
FIG. 14A is a schematic cross-sectional view of a second embodiment of the invention, illustrating a BGA-type semiconductor package thermally connected to a heat sink by way of a heat diffusing member thereof.
Figure 14B:
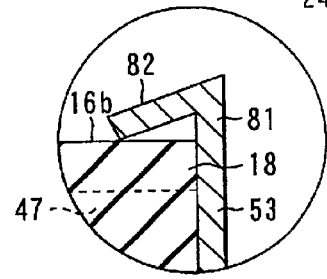
FIG. 14B is an enlarged schematic cross-sectional view of a part surrounded by circle X in FIG. 14A.

FIGS. 14A and 14B schematically illustrate a second embodiment of the invention.

The second embodiment differs from the first embodiment only in terms of the configuration of the lateral plates 47 of the heat diffusing member 45. Otherwise, the second embodiment is identical to the first embodiment.

Each of the lateral plates 47 of the heat diffusing member 45 of this embodiment has extensions 81 extending upward from the upper edges of the respective tongues 53 and each of the extensions 81 is provided with an engaging section 82 formed by inwardly bending an upper end part of the extension 81. The respective engaging sections 82 removably hook on the corresponding other surfaces 16b at the corners 18 of the base substrate 16 of the semiconductor package 15. Thus, the heat diffusing member 45 is held to the semiconductor package 15 at the four corners thereof corresponding to the respective engaging sections 54.

With the above described arrangement of the second embodiment, the heat diffusing member 45 can be held hooked to the semiconductor package 15 mounted on the circuit substrate 13. Therefore, the heat diffusing member 45 is prevented from dropping or being displaced when it is placed in position between the semiconductor package 15 and the heat sink 24. Thus, the heat diffusing member 45 can be handled with ease to improve the efficiency of the operation of assembling the portable computer 1 and the cooling unit 2 and thermally connecting the semiconductor package 15 and the heat sink 24.

Figure 15:
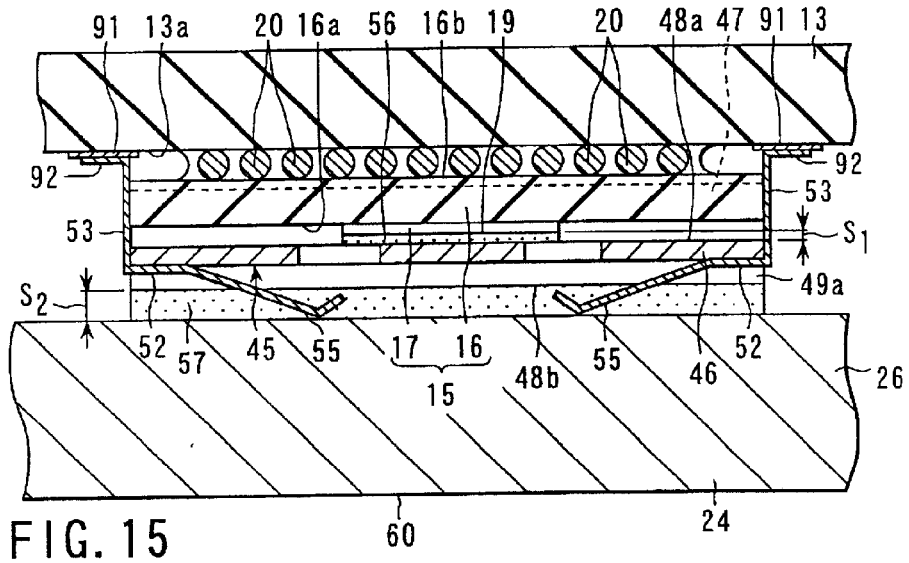
FIG. 15 is a schematic cross sectional view of a third embodiment of the invention, illustrating a BGA-type semiconductor package thermally connected to a heat sink by way of a heat diffusing member thereof.
Figure 16:
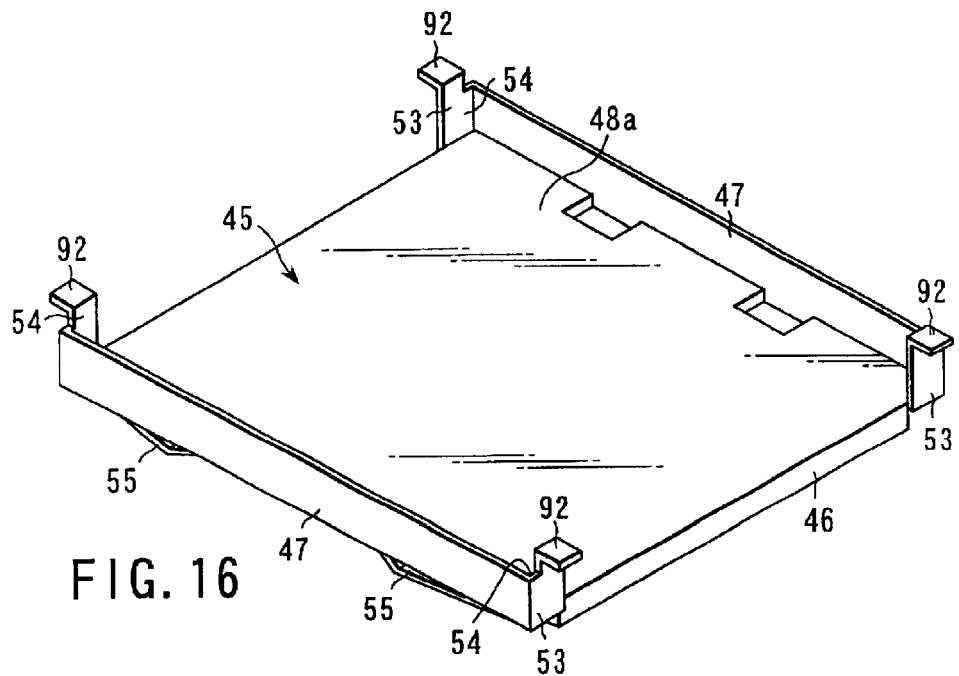
FIG. 16 is a schematic perspective view of a heat diffusing member of a third embodiment.

FIGS. 15 and 16 schematically illustrate a third embodiment of the invention.

The third embodiment differs from the first embodiment only in that the effect of shielding the semiconductor package is improved by utilizing the heat diffusing member 45. Otherwise, the third embodiment is identical to the first embodiment.

As shown in FIG. 15, a number of grounding pads 91 are arranged on the mount surface 13a of the circuit substrate 13. The pads 91 are arranged so as to surround the component mounting region of the semiconductor package 15. The pads 91 are electrically connected to the grounding layer (not shown) on the inside of the circuit substrate 13.

Each of the lateral plates 47 of the heat diffusing member 45 has terminal sections 92 as integral parts thereof extending upward from the upper edges of the respective tongues 53. The terminal sections 92 are arranged so as to surround the semiconductor package 15 and are soldered respectively to the corresponding pads 91 of the circuit substrate 13. Thus, the heat diffusing member 45 is directly connected to the grounding layer of the circuit substrate 13.

With the above described arrangement of the third embodiment, the heat diffusing member 45 cooperates with the circuit substrate 13 to sandwich the semiconductor package 15 and is electrically connected to the grounding layer of the circuit substrate 13. Thus, the heat diffusing member 45 operates as a proximal conductor that is adapted to surround the semiconductor package 15 so that it can be used as a shield for preventing any electromagnetic noise produced by the semiconductor package 15 from leaking out. Therefore, the effect of shielding the semiconductor package 15 can be improved over a wide range from a low frequency zone to a high frequency zone.

Additionally, since the terminal sections 92 of the heat diffusing member 45 are soldered to the circuit substrate 13, the heat diffusing member 45 is rigidly held to the circuit substrate 13. Therefore, the heat diffusing member 45 is prevented from dropping or being displaced when the semiconductor package 15 and the heat sink 24 are thermally connected to each other, improving the efficiency of the operation of assembling the portable computer 1.

Figure 17:
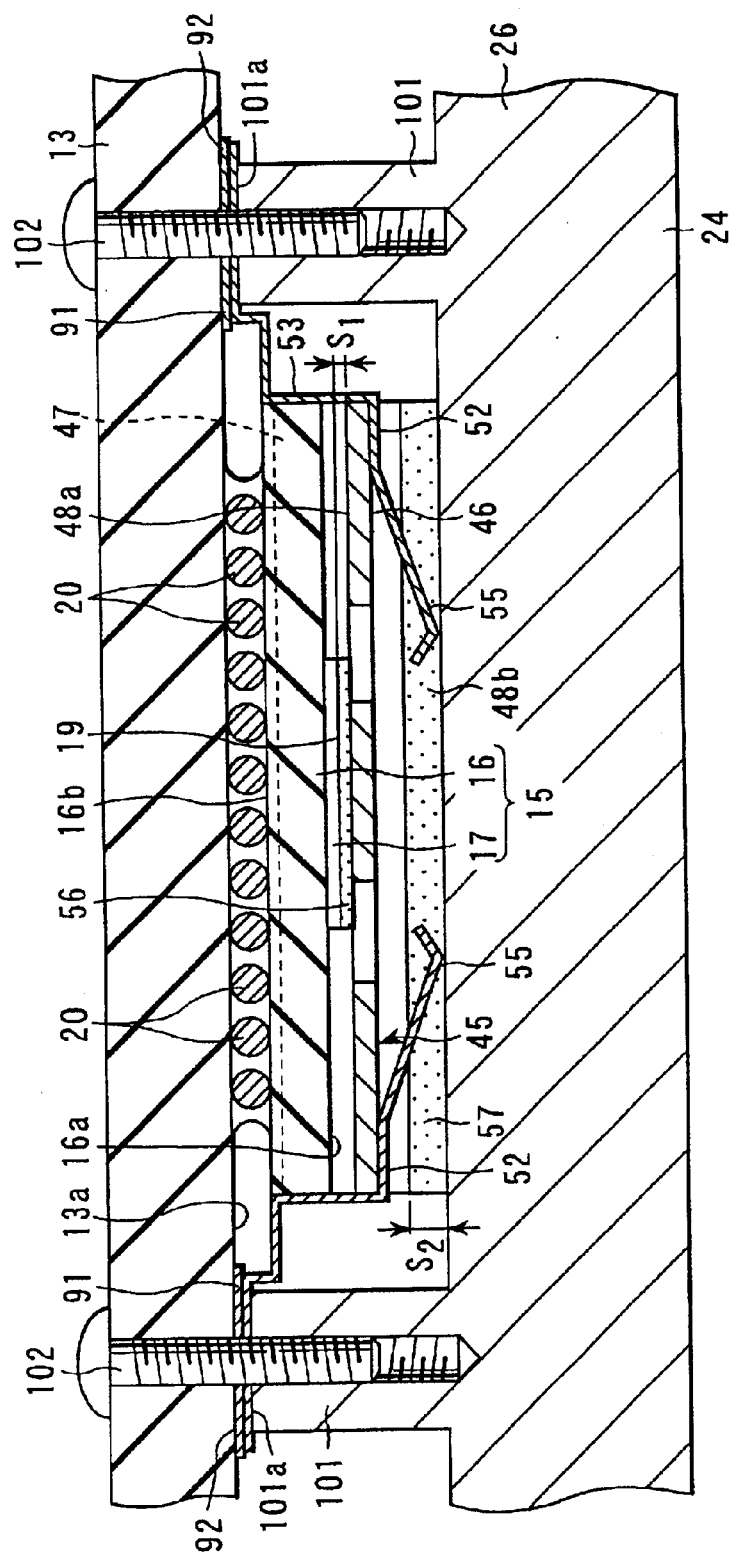
FIG. 17 is a schematic cross-sectional view of a fourth embodiment of the invention, illustrating a BGA-type semiconductor package thermally connected to a heat sink by way of a heat diffusing member thereof.

FIG. 17 schematically illustrates a fourth embodiment of the invention.

In the fourth embodiment, a number of bosses 101 are integrally formed on the heat receiving portion 26 of the heat sink 24. The bosses 101 project upward respectively toward the corresponding pads 91 of the circuit substrate 13. The tip facet 101a of each of the bosses 101 is placed vis-à-vis the corresponding one of the pads 91. The terminal sections 92 of the heat diffusing member 45 are arranged respectively between the tip facets 101a of the bosses 101 and the pads 91.

The circuit substrate 13 is rigidly secured to the bosses 101 by means of screws 102. As a result of this securing arrangement, the terminal sections 92 of the heat diffusing member 45 are pinched respectively between the front facets 101a of the bosses 101 and the corresponding pads 91 and directly connected to the grounding layer of the circuit substrate 13.

With the above described arrangement of the fourth embodiment, the heat diffusing member 45 cooperates with the circuit substrate 13 to sandwich the semiconductor package 15 and is electrically connected to the grounding layer of the circuit substrate 13 as in the case of the third embodiment. Thus, the heat diffusing member 45 operates more reliably as a proximal conductor adapted to surround the semiconductor package 15 so that it can be used as a shield for preventing any electromagnetic noise produced by the semiconductor package 15 from leaking out.

Additionally, the heat diffusing member 45 is rigidly held to the circuit substrate 13 by way of the terminal sections 92. Therefore, the heat diffusing member 45 is prevented from dropping or being displaced when the semiconductor package 15 and the heat sink 24 are thermally connected to each other, improving the efficiency of the operation of assembling the portable computer 1.

Figure 18:
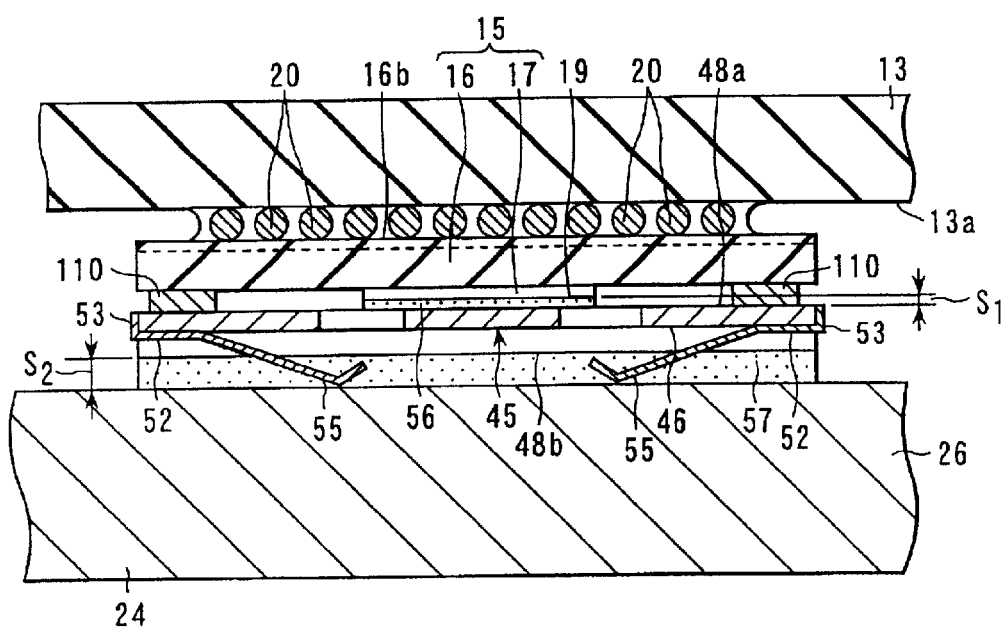
FIG. 18 is a schematic cross-sectional view of a fifth embodiment of the invention, illustrating a BGA-type semiconductor package thermally connected to a heat sink by way of a heat diffusing member thereof.

FIG. 18 schematically illustrates a fifth embodiment of the invention.

In the fifth embodiment, a bulking agent 110 is used fill the gap between the first thermal contact surface 48a of the heat diffusing member 46 and the base substrate 16 of the semiconductor package 15. The bulking agent 110 may typically be a thermoplastic resin material having an adhesive property such as a paraffin-type material. The bulking agent 101 bonds and securely holds the heat diffusing member 45 and the semiconductor package 15 together so as to make them surround the heat generating IC chip 17.

With the above described arrangement of the fifth embodiment, since the heat diffusing member 45 is rigidly secured to the semiconductor package 15 by means of the bulking agent 110, the positional relationship of the semiconductor package 15 and the heat diffusing member 45 is stably maintained. Therefore, the heat diffusing member 45 is prevented from dropping or being displaced when the semiconductor package 15 and the heat sink 24 are thermally connected to each other, improving the efficiency of the operation of assembling the portable computer 1.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A cooling unit to cool a heat generating component, comprising:
    a heat sink arranged adjacent to said heat generating component;
    a heat diffusing member arranged between said heat generating component and said heat sink, the heat diffusing member being attached to the heat generating component at a set relative position;
    a first heat conducting member interposed between said heat generating component and said heat diffusing member to thermally connect said heat generating component and said heat diffusing member; and
    a second heat conducting member interposed between said heat diffusing member and said heat sink to thermally connect said heat diffusing member and said heat sink.

2. The cooling unit according to claim 1, wherein said heat sink has area dimensions greater than said heat generating component.

3. The cooling unit according to claim 1, wherein said heat diffusing member has a thermal conductivity higher than said second heat conducting member and area dimensions greater than said heat generating component.

4. The cooling unit according to claim 1, further including a spring member to urge said heat diffusing member towards said heat generating component.

5. A cooling unit according to claim 1, wherein said first heat conducting member is less thick than said second heat conducting member, and said second heat conducting member is displaced in a direction of thickness.

6. A cooling unit according to claim 1, wherein said heat generating component has a radiation surface, and said heat diffusing member has a first thermal contact surface facing said radiation surface and a second thermal contact surface facing said heat sink, said first and second thermal contact surfaces each having an area larger than said radiation surface.

7. A cooling unit according to claim 6, wherein said heat diffusing member is urged toward said heat generating component by springs.

8. A cooling unit according to claim 1, wherein said first heat conducting member has a thermal conductivity higher than said second heat conducting member.

9. A cooling unit according to claim 1, wherein said heat sink has a heat receiving portion held in contact with said second heat conducting member, and a heat exchanging portion thermally connected to said heat receiving portion and separated from said heat generating component.

10. A cooling unit according to claim 9, further including a fan that feeds cooling air to at least said heat exchanging portion of said heat sink.

11. The cooling unit according to claim 1, further including a fan to feed cooling air to the heat sink.

12. The cooling unit according to claim 1, wherein the heat generating component has a plurality if corners along an outer periphery, and the heat diffusing member has a plurality of engaging sections to be engaged with the respective corners, the set relative position of the heat generating component and the heat diffusing member being determined by a mutual engagement of the corners and the engaging sections.

13. A cooling unit to cool a heat generating component, comprising:
a heat sink arranged adjacent to said heat generating component;
a heat diffusing member arranged between said heat generating component and said heat sink;
a first heat conducting member interposed between said heat generating component and said heat diffusing member to thermally connect said heat generating component and said heat diffusing member;
a second heat conducting member interposed between said heat diffusing member and said heat sink to thermally connect said heat diffusing member and said heat sink; and
wherein said heat generating component has a plurality of corners along an outer periphery, and said heat diffusing member has a plurality of engaging sections to be engaged with the respective corners, a positional relationship of said heat generating component and said heat diffusing member being defined by mutual engagement of said corners and said engaging sections.

14. A cooling unit to cool a heat generating component, comprising:
a heat sink arranged adjacent to said heat generating component;
a heat diffusing member arranged between said heat generating component and said heat sink, wherein said heat diffusing member has a plurality of tongues to be removably hooked to said heat generating component;
a first heat conducting member interposed between said heat generating component and said heat diffusing member to thermally connect said heat generating component and said heat diffusing member; and
a second heat conducting member interposed between said heat diffusing member and said heat sink to thermally connect said heat diffusing member and said heat sink.

15. A cooling unit, comprising:
a semiconductor package having a heat generating IC chip and a base unit on which the IC chip is mounted;
a heat sink arranged adjacent to said semiconductor package, said heat sink having area dimensions greater than said IC chip;
a heat diffusing member arranged between said semiconductor package and said heat sink, the heat diffusing member being rigidly secured to the base unit;
a first heat conducting member interposed between said IC chip of said semiconductor package and said heat diffusing member to thermally connect said IC chip and said heat diffusing member; and
a second heat conducting member interposed between said heat diffusing member and said heat sink to thermally connect said heat diffusing member and said heat sink.

16. The cooling unit according to claim 15, wherein a first gap between the IC chip and the heat diffusing member is narrower than a second gap between the heat diffusing member and the heat sink, the heat diffusing member having a thermal conductivity higher than the second heat conducting member and area dimensions greater than the IC chip.

17. The cooling unit according to claim 15, further including a fan to feed cooling air to the heat sink.

18. A cooling unit, comprising:
a semiconductor package having a heat generating IC chip wherein said semiconductor package has a base substrate bearing said IC chip mounted thereon;
a heat sink arranged adjacent to said semiconductor package, said heat sink having area dimensions greater than said IC chip;
a heat diffusing member arranged between said semiconductor package and said heat sink, wherein said heat diffusing member is rigidly secured to said base substrate;
a first heat conducting member interposed between said IC chip of said semiconductor package and said heat diffusing member to thermally connect said IC chip and said heat diffusing member;
a second heat conducting member interposed between said heat diffusing member and said heat sink to thermally connect said heat diffusing member and said heat sink; and
a gap between said IC chip and said heat diffusing member being narrower than a gap between said heat diffusing member and said heat sink, said heat diffusing member having a thermal conductivity higher than said second heat conducting member and area dimensions greater than said IC chip.

19. An electronic apparatus, comprising:
a housing containing a heat generating component;
a heat sink housed in said housing, said heat sink being arranged adjacent to said heat generating component;
a heat diffusing member arranged between said heat generating component and said heat sink, the heat diffusing member being attached to the heat generating component at a set relative position;
a first heat conducting member interposed between said heat generating component and said heat diffusing member to thermally connect said heat generating component and said heat diffusing member; and
a second heat conducting member interposed between said heat diffusing member and said heat sink to thermally connect said heat diffusing member and said heat sink.

20. An electronic apparatus according to claim 19, wherein a gap between said heat generating component and said heat diffusing member is narrower than a gap between said heat diffusing member and said heat sink, and said second heat conducting member is displaceable according to the gap between said heat diffusing member and said heat sink.

21. An electronic apparatus according to claim 19, further including a circuit substrate housed in said housing and bearing said heat generating component.

22. The electronic apparatus according to claim 19, wherein the heat sink has area dimensions greater than the heat generating component.

23. The electronic apparatus according to claim 19, wherein the heat diffusing member has a thermal conductivity higher than the second heat conducting member and area dimensions greater than the heat generating component.

24. The electronic apparatus according to claim 19, further including a fan housed in the housing to feed cooling air to the heat sink.

25. The cooling unit according to claim 24, wherein the heat diffusing member has a plurality of tongues removably hooked to the heat generating component.

26. A cooling unit to cool a heat generating component, comprising:
   a heat sink arranged adjacent to said heat generating component;
   a base substrate upon which said heat generating component is affixed, said base substrate having four corners;
   a heat diffusing member arranged said heat generating component and said heat sink, said heat diffusing member having four engaging sections corresponding to the four corners of said base substrate to allow said base substrate to fit with said heat diffusing member;
   a first heat conducting member interposed between said heat generating component and said heat diffusing member to thermally connect said heat generating component and said heat diffusing member; and
   a second heat conducting member interposed between said heat diffusing member and said heat sink to thermally connect said heat diffusing member and said heat sink.

27. The cooling unit according to claim 26, further including a spring member to urge said heat diffusing member towards said heat generating component.

28. The cooling unit according to claim 26, wherein said heat sink has area dimensions greater than said heat diffusing member, and said heat diffusion member has area dimensions greater than said heat generating component.

29. The cooling unit according to claim 26, further including a fan to feed cooling air to the heat sink.

30. A cooling unit to cool a heat generating component having a plurality of corners along an outer periphery, comprising:
   a heat sink arranged adjacent to the heat generating component;
   a heat diffusing member arranged between the heat generating component and the heat sink, the heat diffusing member having a plurality of engaging sections to engage with the respective corners, a relative position of the heat generating component and the heat diffusing member being determined by mutual engagement of the corners and the engaging sections;
   a first heat conducting member interposed between the heat generating component and the heat diffusing member to thermally connect the heat generating component and the heat diffusing member; and
   a second heat conducting member interposed between the heat diffusing member and the heat sink to thermally connect the heat diffusing member and the heat sink.

31. A cooling unit to cool a heat generating component affixed to a base substrate having four corners, comprising:
   a heat sink arranged adjacent to said heat generating component;
   a heat diffusing member arranged between said heat generating component and said heat sink, said heat diffusing member having four engaging sections corresponding to the four corners of said base substrate to allow said base substrate to fit with said heat diffusing member;
   a first heat conducting member interposed between said heat generating component and said heat diffusing member to thermally connect said heat generating component and said heat diffusing member; and
   a second heat conducting member interposed between said heat diffusing member and said heat sink to thermally connect said heat diffusing member and said heat sink.

* * * * *